US012581644B2

(12) United States Patent
Wang

(10) Patent No.: US 12,581,644 B2
(45) Date of Patent: Mar. 17, 2026

(54) SEMICONDUCTOR STRUCTURE AND METHOD OF FORMING THE SAME

(71) Applicant: Winbond Electronics Corp., Taichung City (TW)

(72) Inventor: Shou-Te Wang, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 368 days.

(21) Appl. No.: 18/355,903

(22) Filed: Jul. 20, 2023

(65) Prior Publication Data

US 2024/0206158 A1 Jun. 20, 2024

(30) Foreign Application Priority Data

Dec. 15, 2022 (TW) .................................. 111148206

(51) Int. Cl.
*H10B 12/00* (2023.01)
(52) U.S. Cl.
CPC .......... *H10B 12/485* (2023.02); *H10B 12/02* (2023.02)
(58) Field of Classification Search
USPC ........................................................ 257/296
See application file for complete search history.

(56) References Cited

U.S. PATENT DOCUMENTS

| 2001/0023097 | A1* | 9/2001 | Huang | .................... | H10B 12/09 |
| | | | | | 257/306 |
| 2009/0237980 | A1* | 9/2009 | Kim | ........................ | H10B 12/09 |
| | | | | | 365/189.011 |
| 2015/0126013 | A1* | 5/2015 | Hwang | ................ | H10B 12/315 |
| | | | | | 438/672 |
| 2015/0255466 | A1* | 9/2015 | Hwang | ............. | H01L 21/76877 |
| | | | | | 438/586 |
| 2020/0006231 | A1* | 1/2020 | Song | ..................... | H10B 12/315 |
| 2020/0020697 | A1* | 1/2020 | Kim | .................... | H10B 12/0335 |
| 2020/0111795 | A1* | 4/2020 | Feng | ..................... | H10B 12/315 |
| 2022/0085026 | A1* | 3/2022 | Kim | ..................... | H10B 12/315 |
| 2022/0254785 | A1* | 8/2022 | Lai | ........................ | H10B 12/488 |
| 2024/0074146 | A1* | 2/2024 | Kim | ........................ | H10B 63/10 |

FOREIGN PATENT DOCUMENTS

| CN | 113130491 A | 7/2021 |
| TW | 201740510 A | 11/2017 |
| TW | 202243215 A | 11/2022 |

* cited by examiner

*Primary Examiner* — Chineyere Wills-Burns
(74) *Attorney, Agent, or Firm* — MUNCY, GEISSLER, OLDS & LOWE, P.C.

(57) ABSTRACT

A semiconductor structure and a method of forming the same are provided. The semiconductor structure includes a substrate, a word line structure, a dielectric structure, a contact plug, and a sidewall insulating layer. The substrate includes an active region. The word line structure is disposed in the substrate and in the active region. The dielectric structure is disposed on the word line structure. The contact plug is disposed on the substrate and in the active region. The contact plug includes a first conductive pillar disposed on the substrate and a second conductive pillar disposed on the first conductive pillar. The sidewall insulating layer is disposed on an upper portion of a sidewall of the contact plug. The sidewall insulating layer is in contact with the first conductive pillar, the second conductive pillar, and the dielectric structure.

19 Claims, 11 Drawing Sheets

SEMICONDUCTOR STRUCTURE AND METHOD OF FORMING THE SAME

CROSS REFERENCE TO RELATED APPLICATIONS

This Application claims priority of Taiwan Patent Application No. 111148206, filed on Dec. 15, 2022, the entirety of which is incorporated by reference herein.

BACKGROUND OF THE INVENTION

Field of the Invention

The present disclosure relates to a semiconductor structure and a method of forming the same, and, in particular, to a semiconductor structure that may be used as a memory device after further processing and a method of forming the same.

Description of the Related Art

With the trend of miniaturization of semiconductor devices, the size of memory devices continues to shrink. Although existing semiconductor structures and methods of forming the same have gradually met their intended purposes, they have not fully met the requirements placed on them in all respects.

BRIEF SUMMARY OF THE INVENTION

An embodiment of the present disclosure provides a semiconductor structure. The semiconductor structure includes a substrate, a word line structure, a dielectric structure, a contact plug, and a sidewall insulating layer. The substrate includes an active region. The word line structure is disposed in the substrate and in the active region. The dielectric structure is disposed on the word line structure. The contact plug is disposed on the substrate and in the active region. The contact plug includes a first conductive pillar disposed on the substrate and a second conductive pillar disposed on the first conductive pillar. The sidewall insulating layer is disposed on the upper portion of the sidewall of the contact plug. The sidewall insulating layer is in contact with the first conductive pillar, the second conductive pillar, and the dielectric structure.

An embodiment of the present disclosure provides a method of forming a semiconductor structure. The method includes forming a word line structure in an active region of a substrate. A dielectric structure is formed on the word line structure. The dielectric structure has a recess. A sacrificial layer is formed on the recess of the dielectric structure. The top surface of the sacrificial layer is lower than the top surface of the dielectric structure. A sidewall insulating layer is formed on the top surface and a sidewall of the dielectric structure and the top surface of the sacrificial layer. A portion of the sidewall insulating layer is removed to expose the top surface of the dielectric structure and the top surface of the sacrificial layer. The sacrificial layer is removed. A contact plug is formed on the substrate and in the active region. The upper portion of the contact plug is in contact with the sidewall insulating layer.

BRIEF DESCRIPTION OF THE DRAWINGS

FIG. 5 to FIG. 15 respectively show schematic cross-sectional views of the semiconductor structure taken along the line A-B and the line EF shown in FIG. 1.

DETAILED DESCRIPTION OF THE INVENTION

Figure 1:
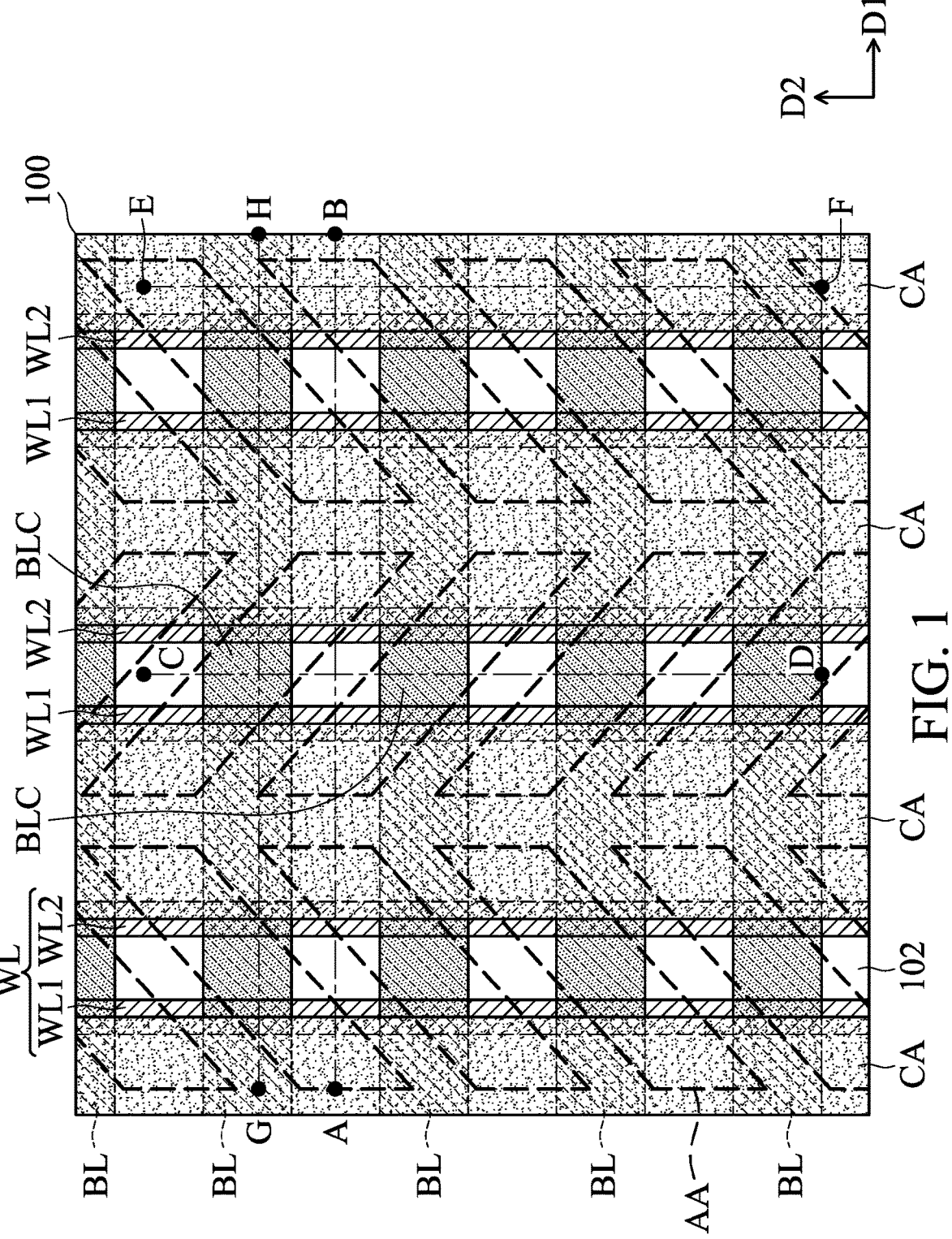
FIG. 1 is a schematic diagram illustrating a circuit layout of a semiconductor structure according to some embodiments.

Referring to FIG. 1, the semiconductor structure includes a substrate 100, and the substrate 100 may include an active region AA and an isolation structure 102. The semiconductor structure may further include a bit line BL, a set of word lines WL, a capacitor contact region CA, and a bit line contact BLC. FIG. 1 simply shows the above components, but may further include other components. The direction D1 and the direction D2 are different from each other and perpendicular to each other. The isolation structure 102 may be formed in the substrate 100 to define the range of the active region AA and the isolation structure 102 may separate two adjacent active regions AA from each other. There may be a plurality of the active regions AA. The active region AA may be formed in the substrate 100. The active regions AA may be disposed in an array in the substrate 100. A column of active regions AA substantially extends along a direction having an included angle with the direction D1, and another adjacent column of active regions AA substantially extends along a direction having another included angle with the direction D1. The isolation structure 102 may be an oxide, such as silicon oxide, and the isolation structure 102 may be a shallow trench isolation structure.

There may be a plurality of bit lines BL. The bit lines BL is disposed on the substrate 100. The bit line BL extends along the direction D1. The adjacent bit lines BL are disposed at intervals along the direction D2. The bit line BL may include a bit line structure. There may be a plurality of sets of word lines WL. The set of word lines WL is disposed in the substrate 100. Adjacent sets of word lines WL are disposed at intervals in the direction D1. The set of word lines WL may be a set of buried word lines. The set of word lines WL may include two word lines WL1 and WL2 extending along the direction D2, respectively. The respective gate structures of the two word lines WL1 and WL2 may be lower than the top surface of the substrate 100. The two word lines WL1 and WL2 may include word line structures, respectively. The capacitor contact region CA may extend along the direction D2 and may be located between adjacent sets of word lines WL. One capacitor contact region CA may be overlapped with two sets of word lines WL. A capacitor contact may be disposed in capacitor contact region CA.

Each active region AA across a set of word lines WL. That is, an active region AA across two word lines WL1 and WL2 in the set of word lines WL. Each active region AA across one bit line BL and across two capacitor contact regions CA. Each active region AA has an overlapping region with the corresponding bit line BL, and non-overlapping regions located on both sides of the overlapping region. In each active region AA, two non-overlapping regions are respectively located in the corresponding capacitor contact region CA. Two capacitor contacts corresponding to one active region AA are respectively disposed in the capacitor contact region CA outside the two word lines WL1 and WL2 passing through the active region AA. The capacitor contact may be in contact with the capacitor. The capacitor contact is located between two adjacent bit lines BL and the capacitor contact is located between two adjacent sets of word lines WL. The active region AA has the bit line contact BLC at the overlapping region with the corresponding bit line BL. When the bit line BL across the corresponding set of word lines WL, the corresponding doped region located between the two word lines WL1 and WL2 may be electrically connected with the bit line contact BLC. Further processing may be performed on the semiconductor structure to form a dynamic random access memory (DRAM).

Figure 2:
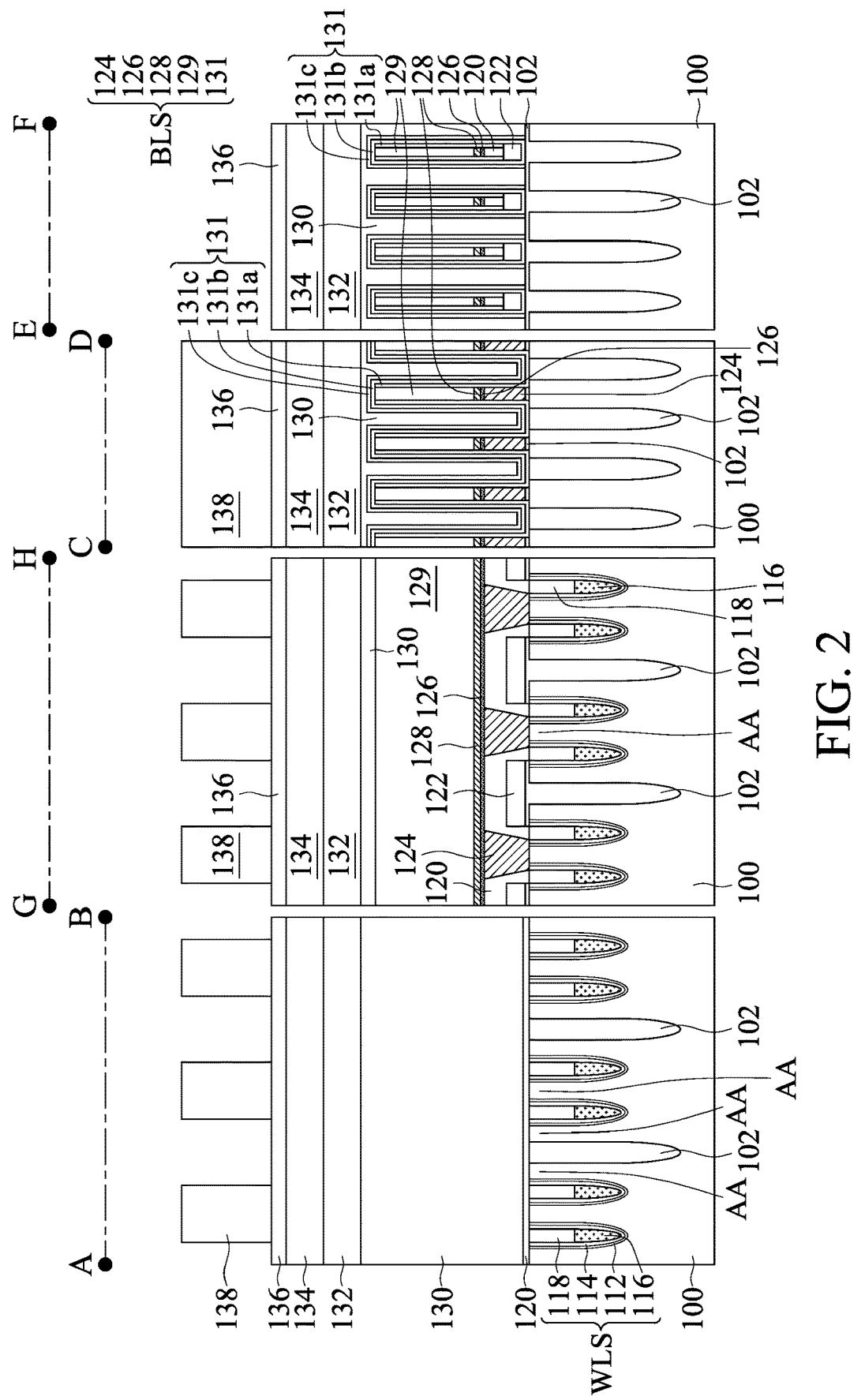
FIG. 2 to FIG. 15 are schematic cross-sectional views illustrating various stages of forming a semiconductor structure according to some embodiments, respectively. Wherein, FIG. 2 to FIG. 4 respectively show schematic cross-sectional views of the semiconductor structure taken along the line A-B, the line C-D, the line E-F, and the line G-H shown in FIG. 1.

Referring to FIG. 2, the (sectional) line A-B is parallel to the bit line BL and does not overlap with the bit line BL. The (sectional) line G-H is parallel to the bit line BL and overlaps with the bit line BL. The (sectional) line C-D is parallel to word line WL1 and does not overlap with the capacitor contact region CA. The (sectional) line E-F is parallel to word line WL1 and overlaps with the capacitor contact region CA. The same elements are not described in detail. As shown in the schematic cross-sectional view of line A-B in FIG. 2, the semiconductor structure may include a word line structure WLS. The word line structure WLS is formed in the active region AA. The word line structure WLS may include a gate dielectric layer 112, a barrier layer 114, a gate electrode 116, and a protective layer 118. The gate dielectric layer 112 may include oxide, nitride, oxynitride, high dielectric constant (high-k) material, for example, may be silicon oxide. The barrier layer 114 may be titanium nitride. The gate electrode 116 may be doped or undoped polysilicon, amorphous silicon, metals such as tungsten, copper, silver, gold, cobalt, metal nitrides such as tungsten nitride, titanium nitride, conductive metal oxide, other suitable materials, or a combination thereof, for example, may be tungsten. The protective layer 118 may include oxide, nitride, oxynitride, for example, may be silicon nitride.

The semiconductor structure may further include a (first) dielectric layer 120 disposed on the word line structure WLS, and a (second) dielectric layer 130 disposed on the dielectric layer 120. The dielectric layer 120 may be silicon nitride. The semiconductor structure may further include a hard mask layer and a patterned photoresist layer 138 disposed on the dielectric layer 130. The hard mask layer may include a hard mask layer 132 disposed on the dielectric layer 130, a hard mask layer 134 disposed on the hard mask layer 132, and a hard mask layer 136 disposed on the hard mask layer 134. The hard mask layer 132 may be an oxide formed by tetraethoxysilane (TEOS) as a precursor, the hard mask layer 134 may be carbon, and the hard mask layer 136 may be silicon oxynitride.

As shown in the schematic cross-sectional view of line G-H in FIG. 2, the semiconductor structure may include an oxide layer 122 on the isolation structure 102. The semiconductor structure may further include bit line conductive layers 124, 126, and 128 sequentially disposed on the active region AA. The bit line conductive layers 124, 126, and 128 may be a portion of the bit line structure BLS. The bit line conductive layers 124, 126, and/or 128 may be doped or undoped polysilicon, amorphous silicon, metals, metal nitrides, conductive metal oxides, other suitable materials, or a combination thereof. The bit line conductive layer 124 may be polysilicon, the bit line conductive layer 126 may be a bilayer including a titanium layer and a titanium nitride layer, and the bit line conductive layer 128 may be tungsten. The semiconductor structure further includes a mask layer 129 disposed on the bit line conductive layer 128 to pattern the bit line structure. The mask layer 129 may be formed by a deposition process. The mask layer 129 is silicon nitride.

As shown in the schematic cross-sectional view of line C-D in FIG. 2, the semiconductor structure may include the bit line structure BLS electrically connected to the bit line contact BLC. The bit line structure BLS may include bit line conductive layers 124, 126, and 128, the mask layer 129, and spacer 131. The spacer 131 is disposed on sidewalls of the bit line conductive layers 124, 126, and 128 and the mask layer 129. The spacer 131 may be a single layer structure or a multilayer structure. The spacer 131 may include spacers 131a, 131b, and 131c arranged in sequence. The spacers 131a and 131b may be silicon nitride, and the spacer 131c may be silicon oxide. An oxide layer 122 may be disposed under the dielectric layer 120.

Figure 3:
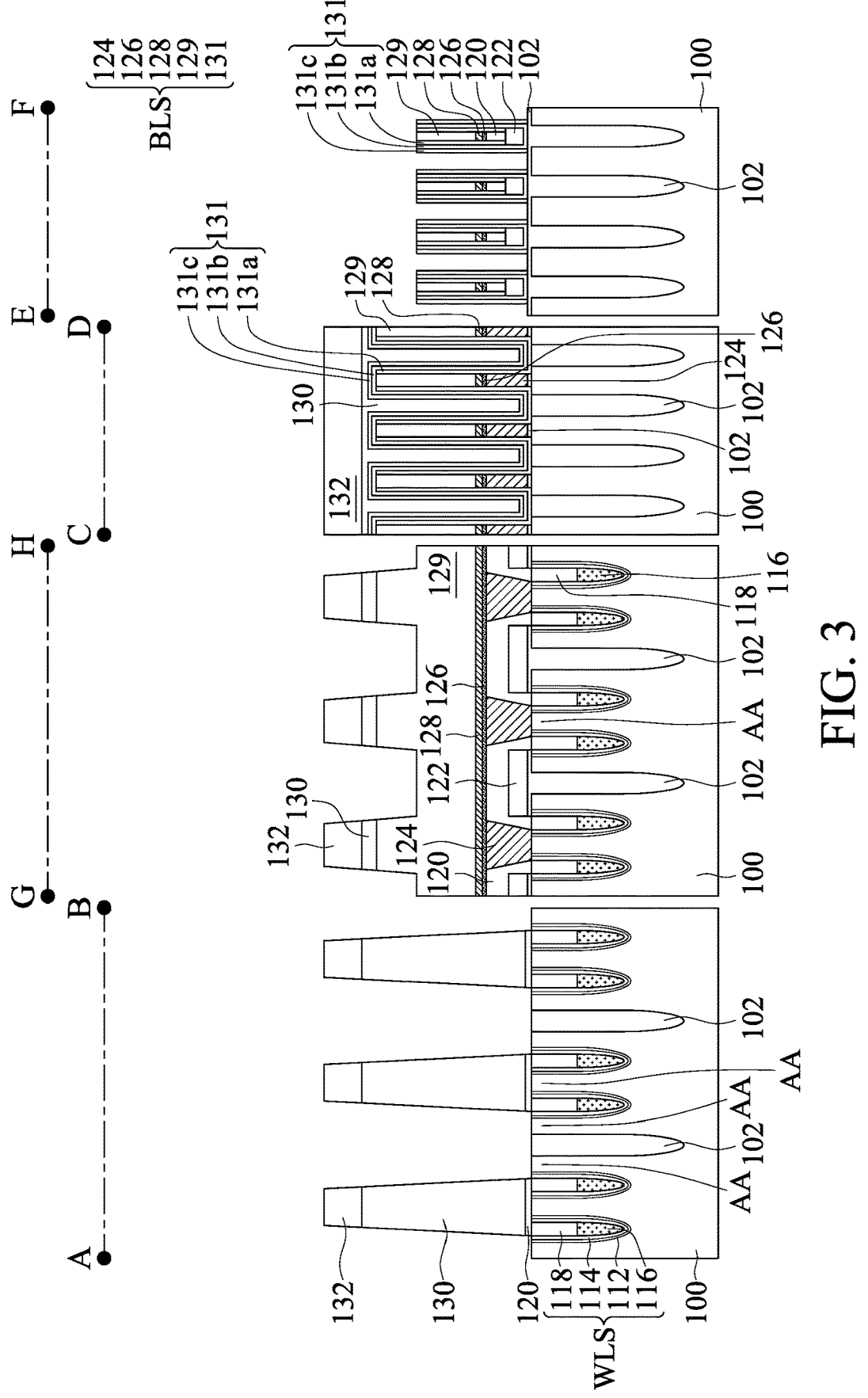

Referring to FIG. 3, a patterning process is performed to expose the top surface of the substrate 100. The top surface of the isolation structure 102 is exposed and a portion of the top surface of the active region AA is exposed. A removal process such as an ashing process, an etching process, and/or a planarization process is performed to remove the patterned photoresist layer 138 and the hard mask layers 136 and 134.

Figure 4:
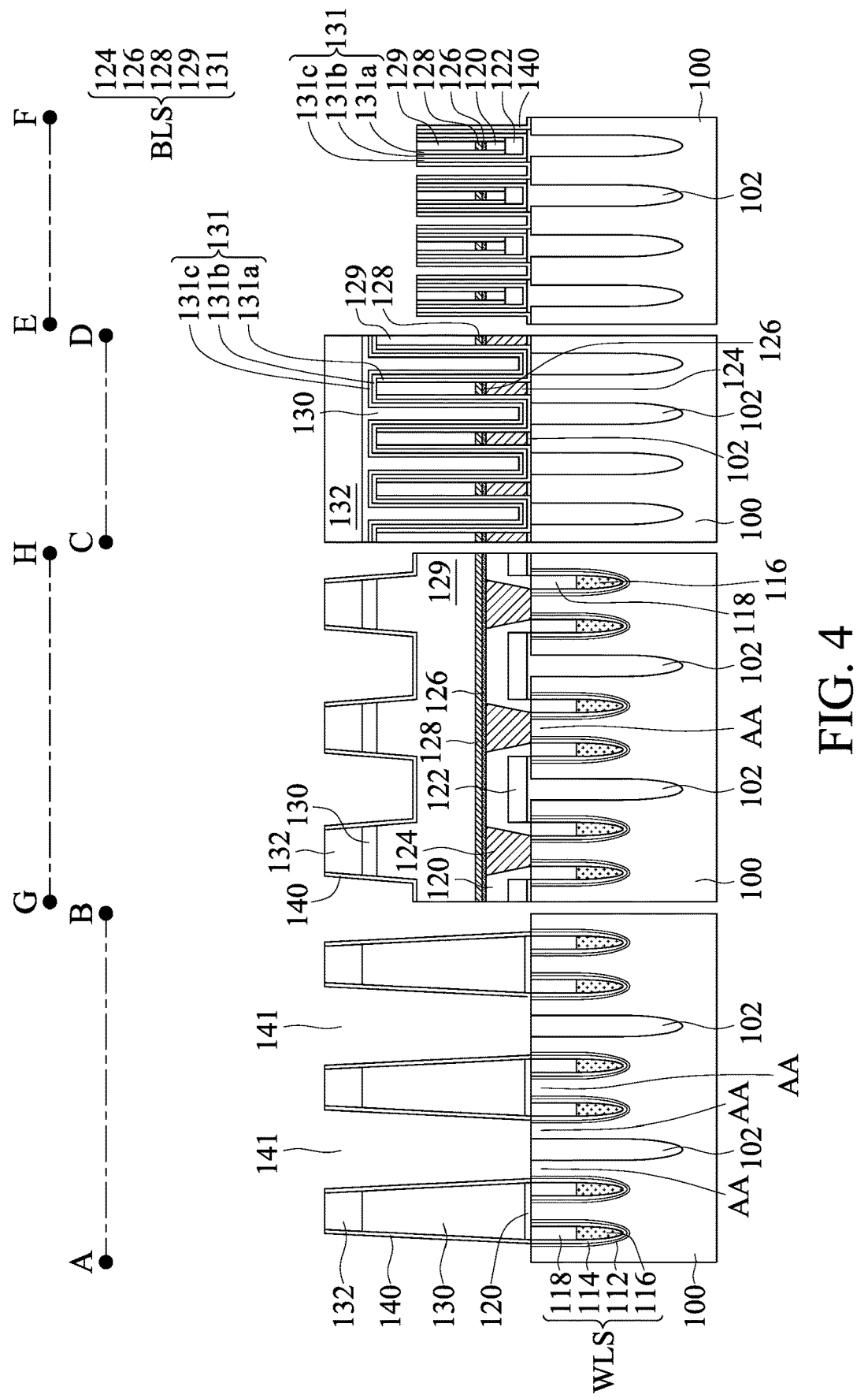

Referring to FIG. 4, a (third) dielectric layer 140 may be formed on the sidewalls of the dielectric layers 120 and 130 and the hard mask layer 132. The dielectric layer 140 may be formed by a deposition process. The dielectric layer 140 on the hard mask layer 132 may be removed by an etching process. The dielectric layer 140 may be silicon oxide or silicon nitride. The etching rate of the dielectric layer 140 may be less than the etching rate of the dielectric layer 130, so as to prevent the dielectric layer 130 from being damaged by the etching process. The etching rate of the dielectric layer 140 may be less than the etching rate of the dielectric layer 120, so as to prevent the dielectric layer 120 from being damaged by the etching process. The dielectric structure may include dielectric layers 120, 130 and 140, and the dielectric structure may be formed on the word line structure WLS. The dielectric layer 140 may be disposed on the active region AA and the isolation structure 102. The dielectric structure may have a recess 141. The recess 141 may be disposed between adjacent dielectric structures. The recess 141 may be located between adjacent sets of word lines. The recess 141 may be located on the isolation structure 102.

Figure 5:
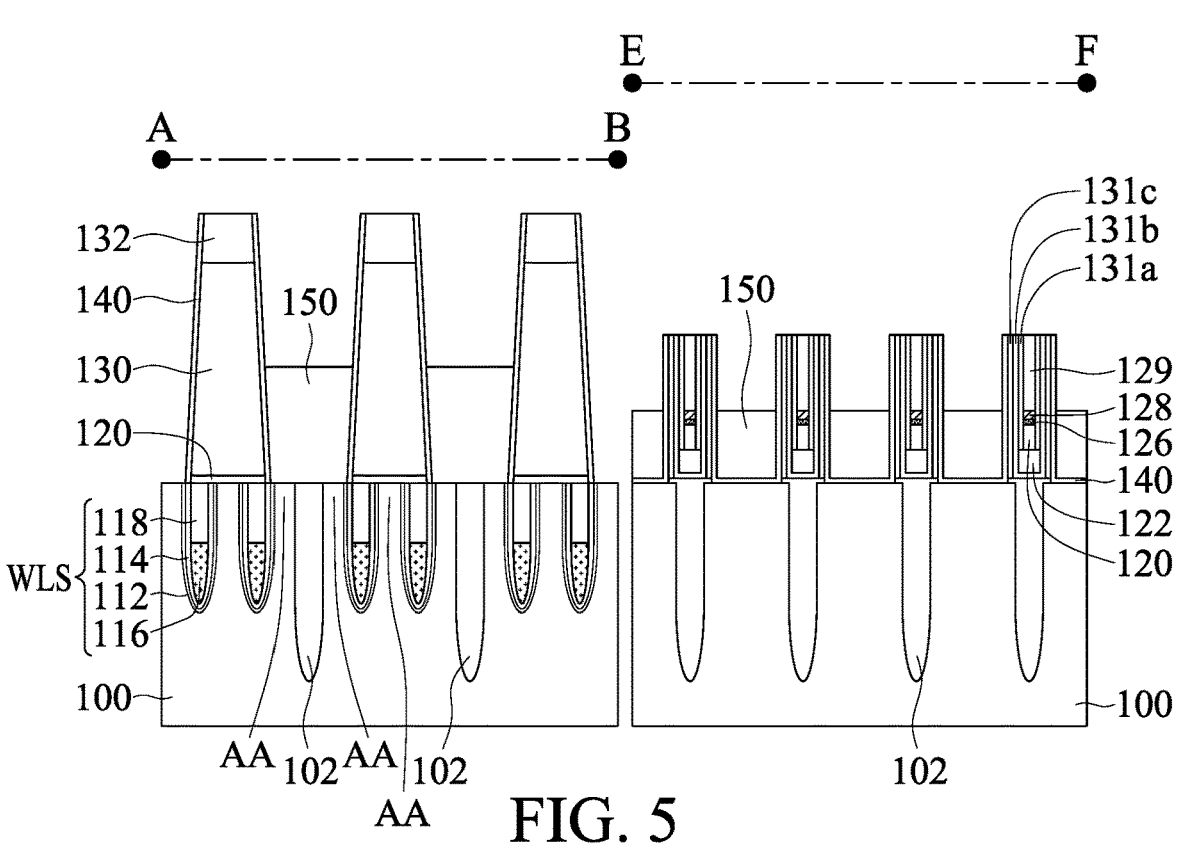

Referring to FIG. 5, a sacrificial layer 150 is formed on the recess 141 of the dielectric structure, and the top surface of the sacrificial layer 150 is lower than the top surface of the dielectric structure. The sacrificial layer 150 is blanketly deposited on the hard mask layer 132, the dielectric layer 140, the active region AA, and the isolation structure 102, in order to fill the recess 141 with the sacrificial layer 150. The sacrificial layer 150 is etched back, such that the top surface of the sacrificial layer 150 is lower than the top surface of the hard mask layer 132. The top surface of the sacrificial layer 150 may be lower than the top surface of the dielectric layer 130. The sacrificial layer 150 may cover the lower portion of the sidewall of the dielectric layer 140. The height of the etched back sacrificial layer 150 is substantially the same as the height of the subsequently formed conductive pillars. The difference of the height between the top surface of the sacrificial layer 150 and the top surface of the dielectric layer 130 is substantially the same as the height of the subsequently formed sidewall insulating layer. The sacrificial layer 150 may include oxide, nitride, oxynitride, or a combination thereof. The sacrificial layer 150 may be a spin-on glass oxide.

Figure 6:
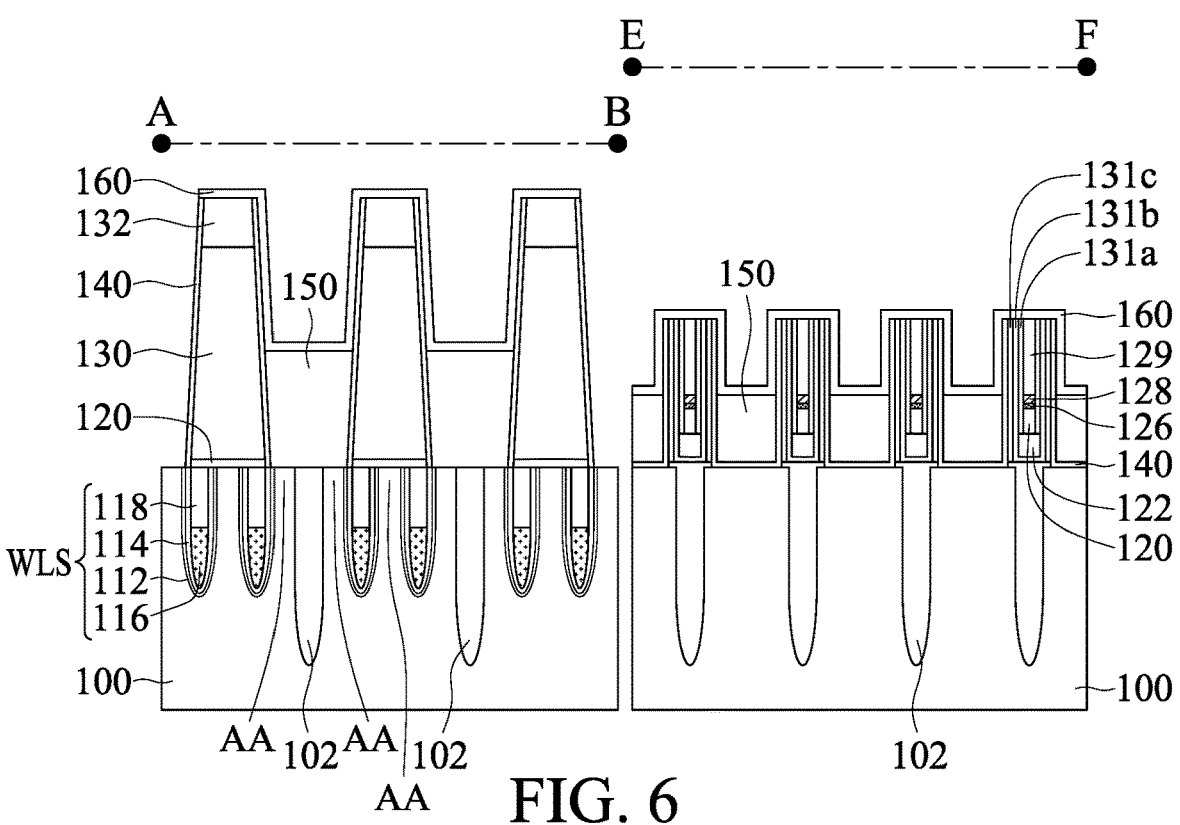

Referring to FIG. 6, an insulating material 160 may be conformally deposited on the dielectric structure and the sacrificial layer 150. The insulating material 160 is conformally deposited on the top surface of the hard mask layer 132, the top surface and sidewalls of the dielectric layer 140, and the top surface of the sacrificial layer 150. in order to provide insulating properties. The etching rate of the insulating material 160 may be less than the etching rate of the dielectric layer 130. That is, the etching rate of the subsequently formed sidewall insulating layer may be less than the etching rate of the dielectric layer 130.

Figure 7:
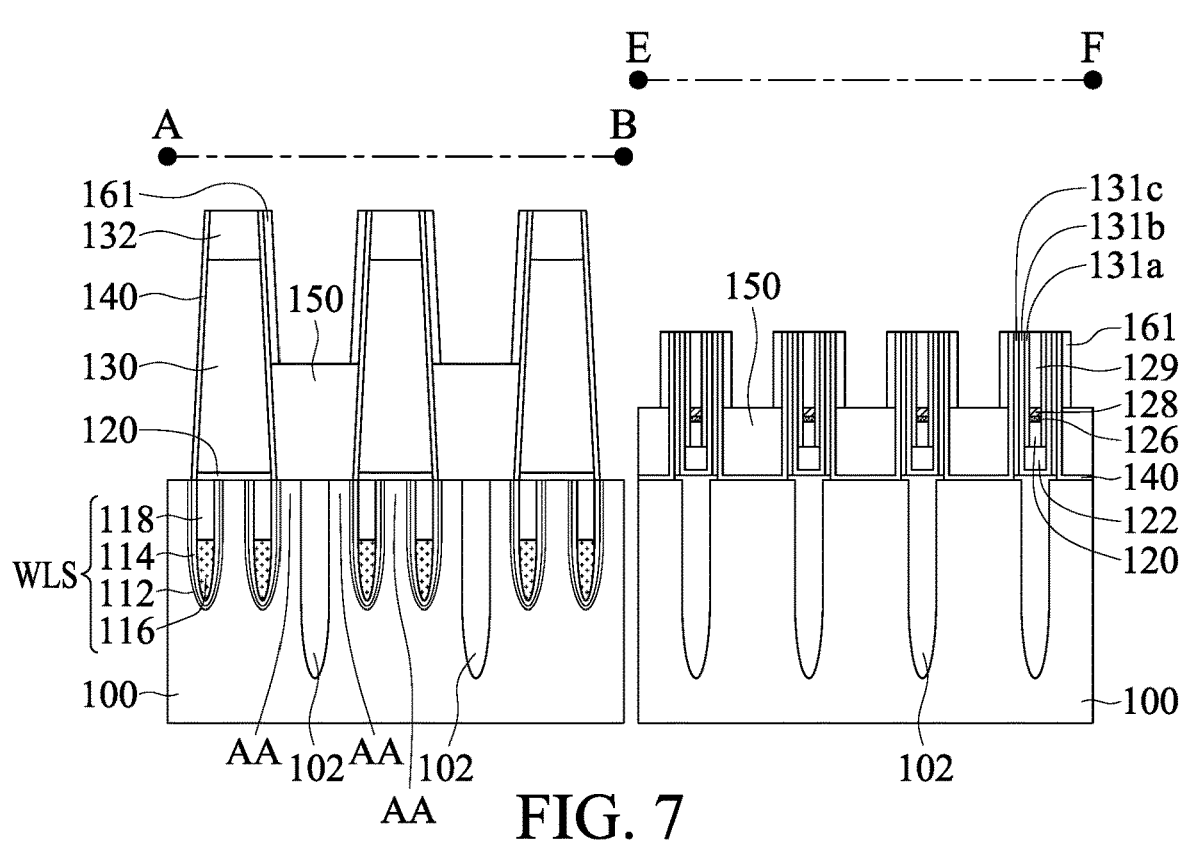

Referring to FIG. 7, a portion of the insulating material 160 may be removed to expose the top surface of the dielectric structure and the top surface of the sacrificial layer 150. The insulating material 160 on the top surface of the hard mask layer 132 and the insulating material 160 on the top surface of the sacrificial layer 150 may be removed by a anisotropic etching. A portion of the insulating material 160 is removed, and another portion of the insulating material 160 is remained on the upper portion of the sidewall of the dielectric structure (dielectric layer 140), thereby forming a sidewall insulating layer 161. The sidewall insulating layer 161 may be disposed on the upper portion of the sidewall of the dielectric layer 140 and the sidewall insulating layer 161 may be in contact with the sidewall of the dielectric layer 140 and the top surface of the sacrificial layer 150. The sidewall insulating layer 161 may expose a portion of the top surface of the sacrificial layer 150. The sidewall insulating layer 161 may be located on the substrate 100 and the sacrificial layer 150 is disposed between the sidewall insulating layer 161 and the substrate 100. The sidewall insulating layer 161 is separated from the substrate 100 by a distance. The sidewall insulating layer 161 may not reduce the contact region between the contact plug and the substrate 100, and a process margin of the semiconductor structure may be maintained.

Figure 8:
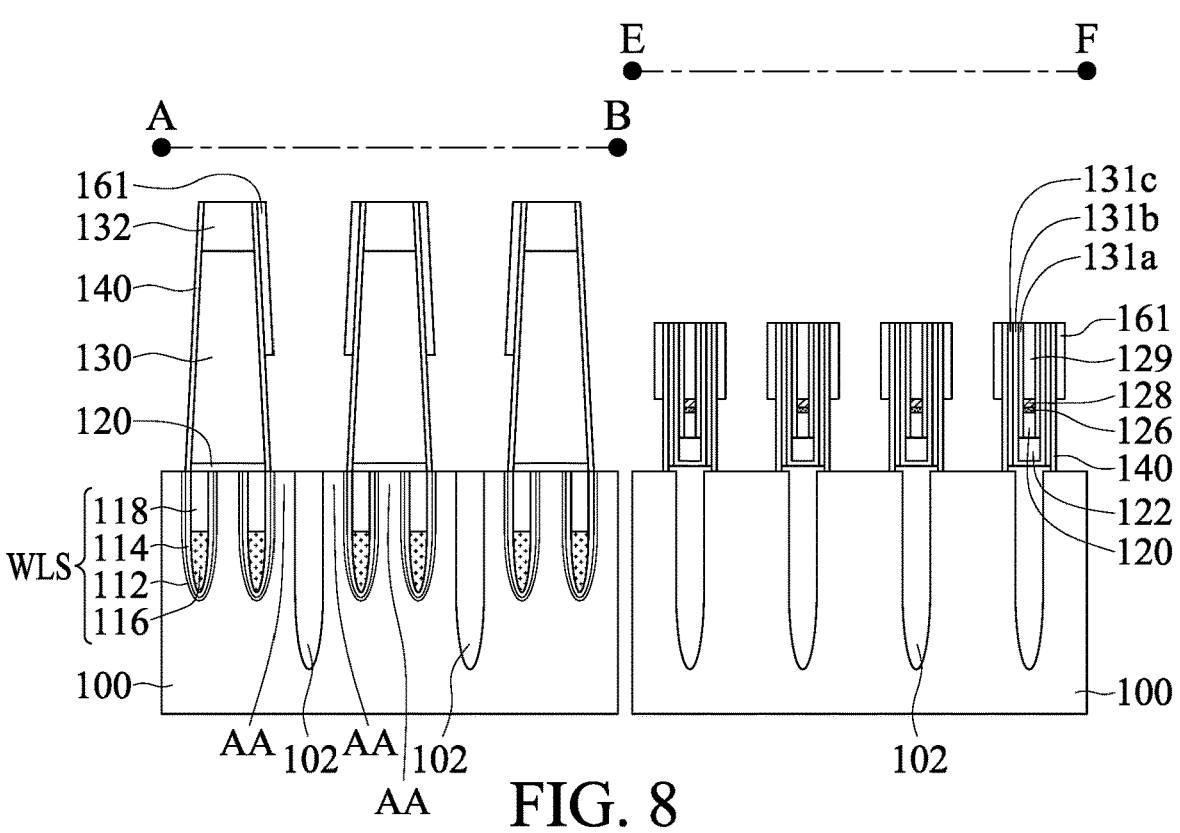

Referring to FIG. 8, the sacrificial layer 150 may be removed. The sidewall insulating layer 161 exposes the top surface of the sacrificial layer 150 so that the sacrificial layer 150 may be removed by a wet etching process. The sacrificial layer 150 is removed by the wet etch process to expose the top surface of the substrate 100. The top surface of the active region AA and the top surface of the isolation structure 102 are exposed.

Figure 9:
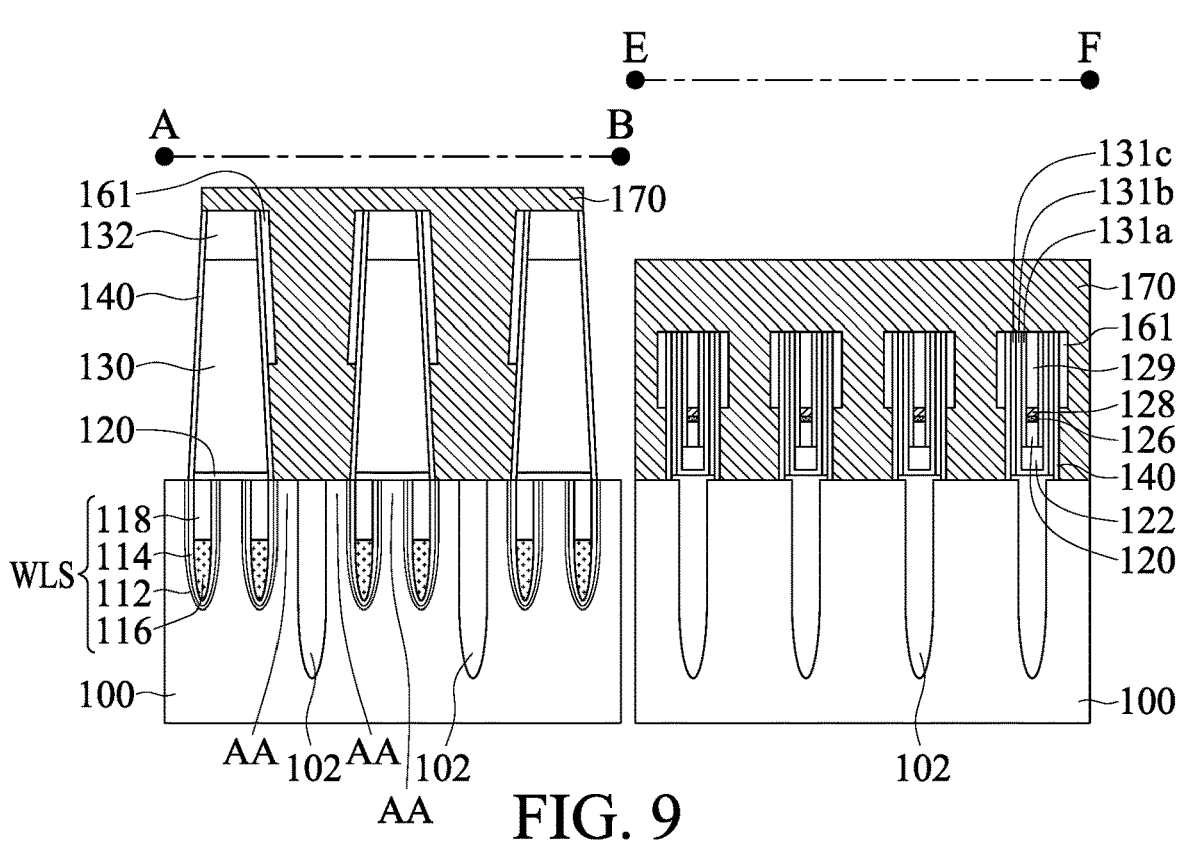

Referring to FIG. 9, a conductive material 170 is blanketly deposited on the active region AA and the isolation structure 102. The conductive material 170 may include polysilicon, amorphous silicon, metal, metal nitride, conductive metal oxide, other suitable materials, for example, the conductive material 170 may include polysilicon.

Figure 10:
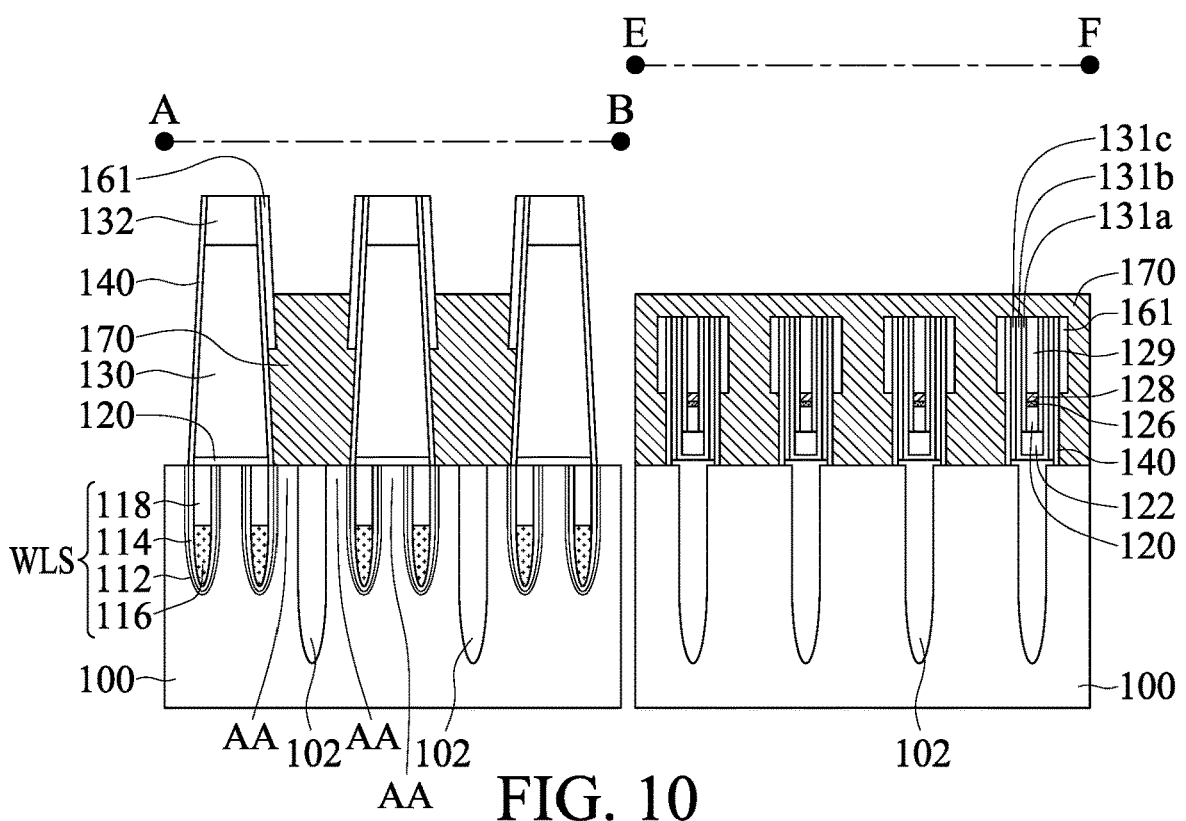

Referring to FIG. 10, the conductive material 170 is etched back so that the top surface of the conductive material 170 is lower than the top surface of the dielectric structure. The top surface of the conductive material 170 may be lower than the top surface of the dielectric layer 130. The top surface of the conductive material 170 may be disposed between the top surface of the sidewall insulating layer 161 and the bottom surface of the sidewall insulating layer 161. The conductive material 170 covers a portion (for example, a lower portion) of the sidewall of the sidewall insulating layer 161 and exposes another portion of the sidewall of the sidewall insulating layer 161.

Figure 11:
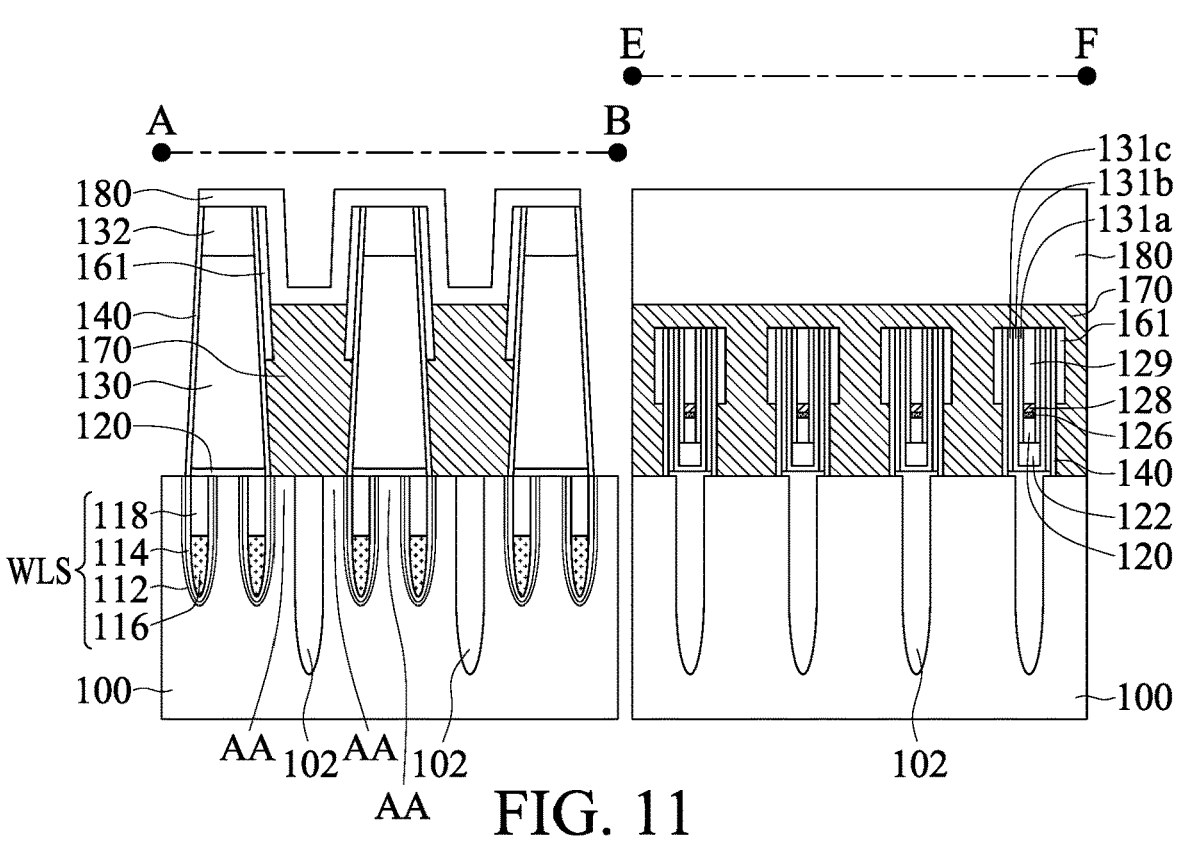

Referring to FIG. 11, a self-alignment layer 180 may be deposited on the dielectric structure, the sidewall insulating layer 161, and the conductive material 170. The self-alignment layer 180 is conformally deposited on the top surface of the hard mask layer 132, the top surface and sidewalls of the dielectric layer 140, the top surface and sidewalls of the sidewall insulating layer 161, and the top surface of the conductive material 170. The self-alignment layer 180 may be silicon nitride.

Figure 12:
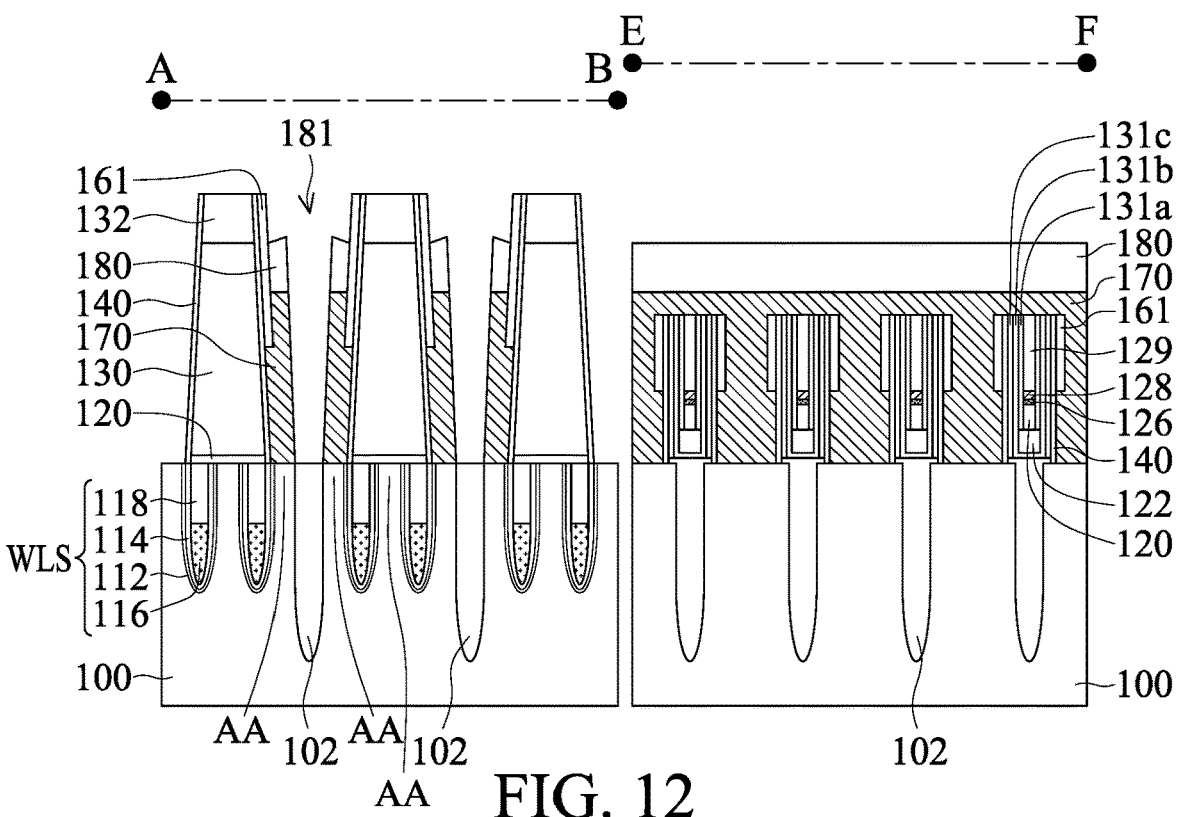

Referring to FIG. 12, a self-alignment etching process is performed to remove a portion of the self-alignment layer 180 and a portion of the conductive material 170 to expose the top surface of the dielectric structure and the top surface of the isolation structure 102. Since the self-alignment layer 180 has a specific thickness, the self-alignment etching process may be performed without an additional mask to reduce the process cost. The self-alignment layer 180 on the top surface of the hard mask layer 132, on the top surface of the dielectric layer 140, on the top surface and sidewalls of the sidewall insulating layer 161, and on the isolation structure 102 is removed, and the conductive material 170 on the isolation structure 102 is removed as well. The self-alignment layer 180 and the conductive material 170 are remained on the active region AA. The self-alignment layer 180 on the active region AA may have an inclined top surface, and the thickness of the self-alignment layer 180 adjacent to the sidewall insulating layer 161 is smaller than the thickness of the self-alignment layer 180 away from the sidewall insulating layer 161. After the self-alignment etching process is performed, an opening 181 is formed on the isolation structure 102. The opening 181 may be used to accommodate a subsequently formed intermediate portion. The intermediate portion is used to electrically isolate adjacent contact plugs. The opening 181 may be located between adjacent conductive materials 170 which are subjected by the self-alignment etching. After the self-alignment etching process is performed, the conductive material 170 may be located on two sides of the isolation structure 102, respectively. Therefore, the conductive material 170 may be used as a contact plug.

Figure 13:
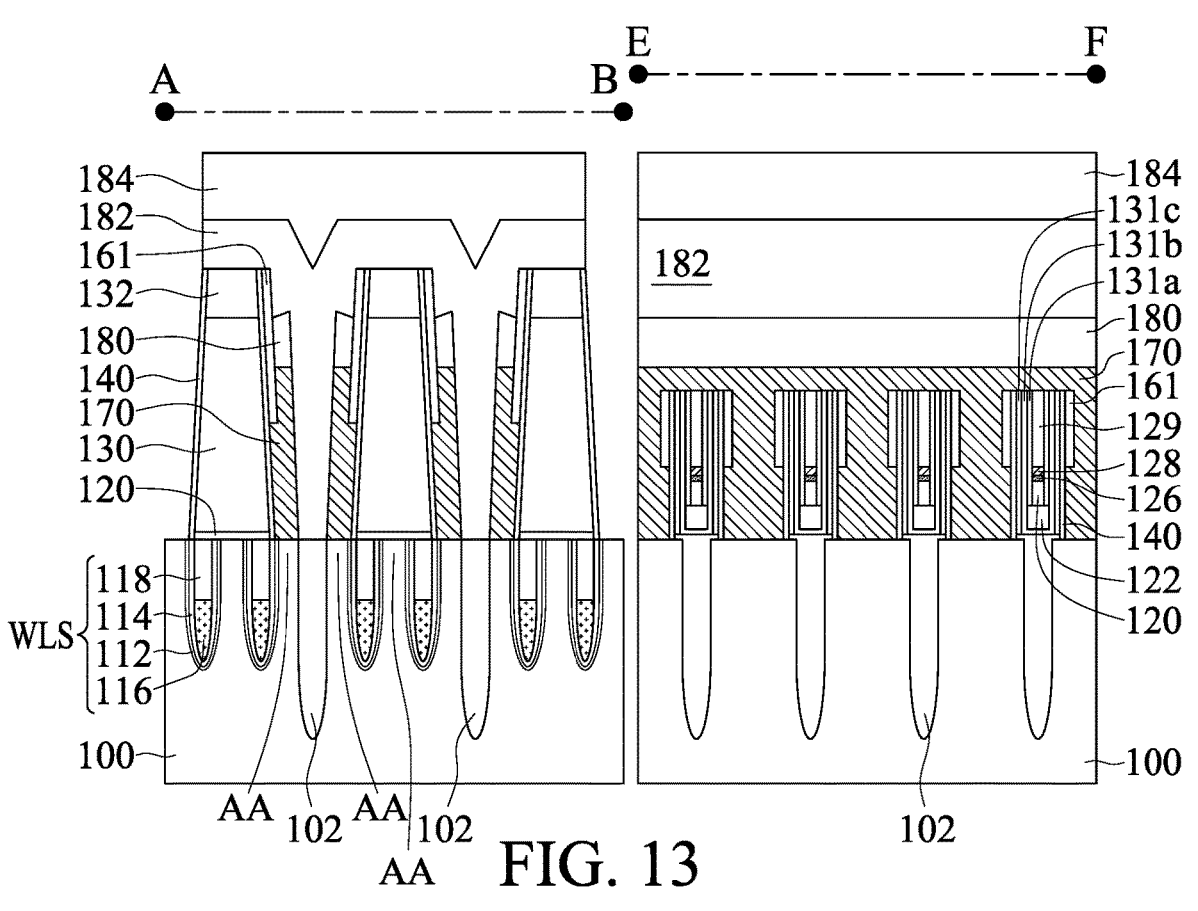

Referring to FIG. 13, an intermediate layer 182 and a bottom anti-reflective layer (BARC) 184 are sequentially formed on the top surface of the dielectric structure and the isolation structure 102. The intermediate layer 182 is conformally deposited on the top surface of the hard mask layer 132, the top surface of the dielectric layer 140, the top surface and sidewalls of the sidewall insulating layer 161, the top surface and sidewalls of the self-alignment layer 180, the sidewalls of the conductive material 170, and isolation structure 102, such that the intermediate layer 182 fills the opening 181. The intermediate layer 180 includes an insulating material. The intermediate layer 182 is deposited into the opening 181 until the opening 181 is completely filled with the intermediate layer 182 to separate the conductive materials 170. The intermediate layer 182 and the self-alignment layer 180 may include the same or different materials, such as silicon nitride. The bottom anti-reflective layer 184 may be deposited on the intermediate layer 182. The bottom anti-reflective layer 184 may be oxide or carbide.

Figure 14:
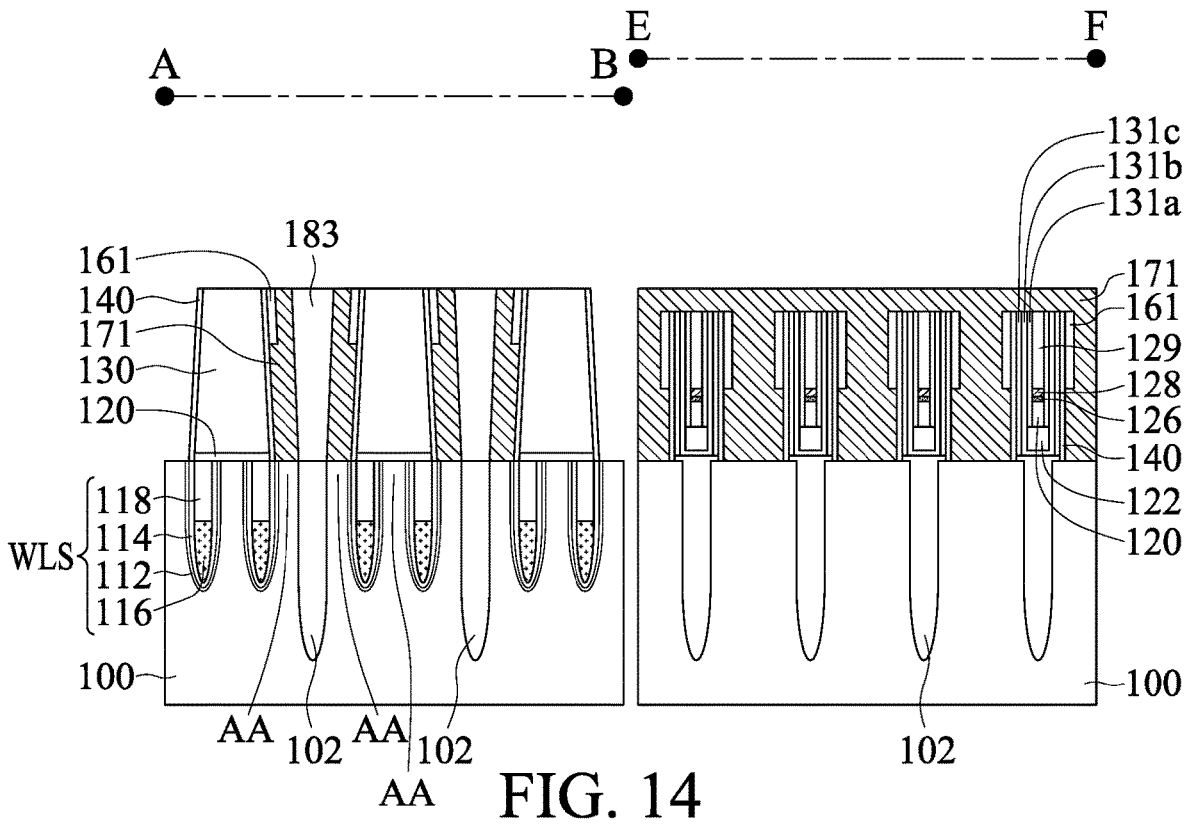

Referring to FIG. 14, a planarization process is performed, so that the top surface of the conductive material is aligned with the top surface of the sidewall insulating layer 161 and the top surface of the intermediate layer 182, in order to form the (first) conductive pillar 171 and the intermediate portion 183. A destructive full etch process is performed to remove the hard mask layer 132, the intermediate layer 182, and the bottom anti-reflective layer 184, to expose the top surface of the dielectric layer 130, the top surface of the dielectric layer 140, the top of the sidewall insulating layer 161, the top surface of the conductive pillar 171, and the top surface of the intermediate portion 183. The intermediate portion 183 may be disposed between the adjacent conductive pillars 171, so that the adjacent conductive pillars 171 are electrically isolated. The intermediate portion 183 may be formed on the isolation structure 102, and the intermediate portion 183 may provide electrical isolation between adjacent contact plugs. The conductive pillar 171 is formed on the active region AA and the conductive pillar 171 is in direct contact with the substrate 100.

Figures 15, 16:
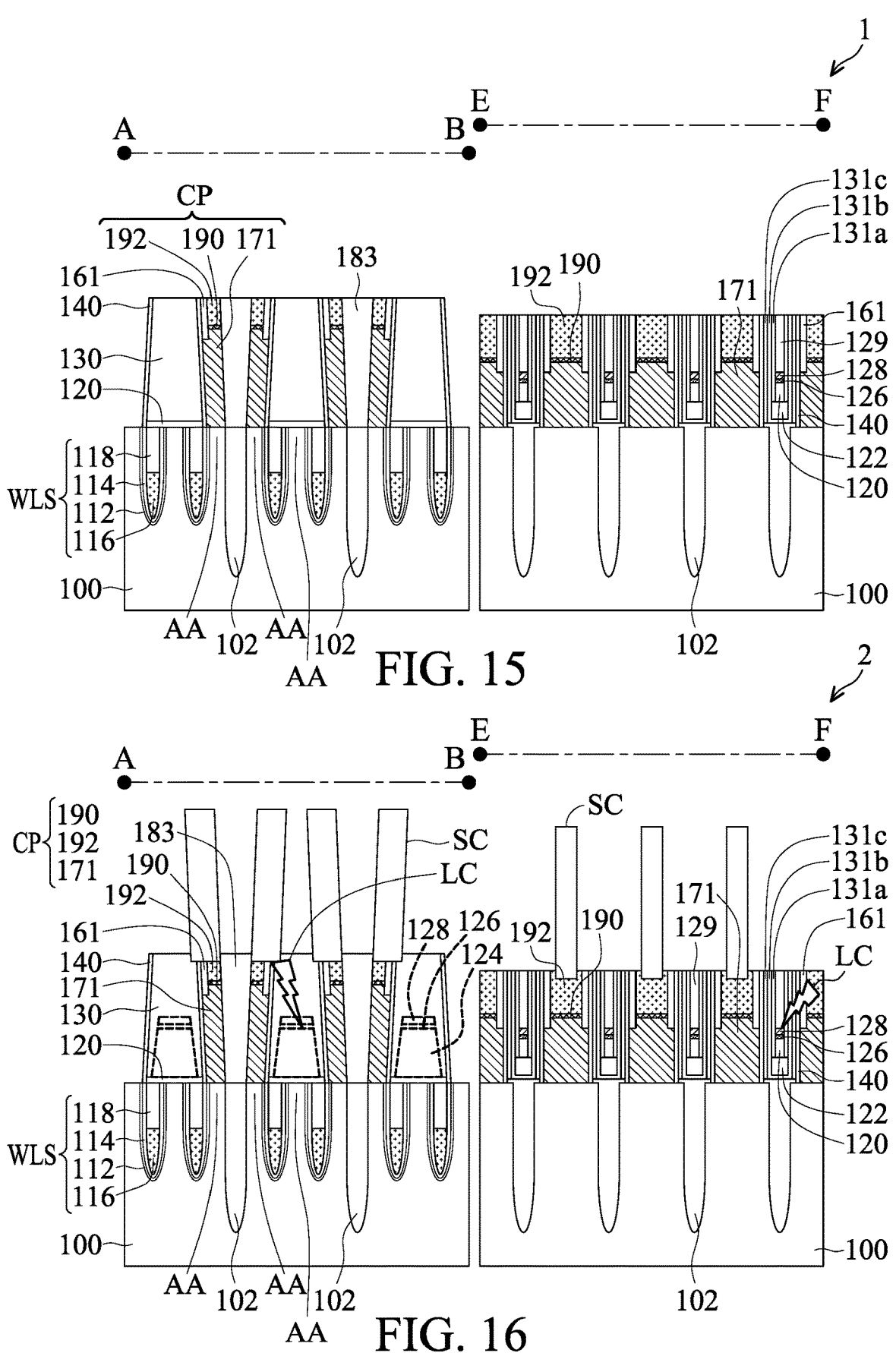
FIG. 16 is a schematic cross-sectional view illustrating leakage current in a semiconductor structure according to some embodiments.

Referring to FIG. 15, a contact plug CP is formed on the substrate 100 and in the active region AA to obtain a semiconductor structure 1. The conductive pillar 171 is etched back so that the top surface of the conductive pillar 171 is located between the top surface and the bottom surface of the sidewall insulating layer 161. Therefore, by controlling the etching back depth of the conductive pillar 171, it is possible to ensure that the sidewall insulating layer 161 covers the subsequently formed liner and the sidewalls of the conductive pillar. Therefore, the electrical isolation characteristics may be ensured. The liner 190 is formed on the conductive pillar 171, and the top surface of the liner 190 is lower than the top surface of the sidewall insulating layer 161. The liner 190 may be formed by a deposition process. The liner 190 may improve the compatibility between the conductive pillars 171 and 192 which include different materials. A (second) conductive pillar 192 is formed on the liner 190. In some embodiments, the liner 190 may be omitted, and the conductive pillar 192 may be directly formed on the conductive pillar 171. The formation methods and materials of the conductive pillar 192 and the conductive pillar 171 may be the same or different. The conductive pillar 171 may be polysilicon, the liner 190 may be cobalt, and the conductive pillar 192 may be tungsten.

The contact plug CP may include a conductive pillar 171, a liner 190, and a conductive pillar 192. The contact plug CP may have an L-shape or a left-right reversed L-shape. The sidewall insulating layer 161 is disposed on the upper portion of the sidewall of the contact plug CP. The upper portion of the contact plug CP may be in direct contact with the sidewall insulating layer 161. The sidewall insulating layer 161 is disposed on the sidewalls of the conductive pillars 192 and the sidewalls of the liner 190. The sidewall insulating layer 161 may be disposed on the upper portion of the sidewall of the conductive pillar 171 and the sidewall insulating layer 161 does not be disposed on the lower portion of the sidewall of the conductive pillar 171. The sidewall insulating layer 161 is in direct contact with the conductive pillar 171, the liner 190, the conductive pillar 192, and the dielectric layer 140 of the dielectric structure. The bottom surface of the sidewall insulating layer 161 is lower than the bottom surface of the conductive pillar 192 or the bottom surface of the liner 190, so as to enhance the extension depth of the sidewall insulating layer 161 toward the substrate 100 for providing electrical isolation. By adjusting the extension depth of the sidewall insulating layer 161 toward the substrate 100, the CZ-GC short and/or the SC-GC short may be avoided. The top surface of the conductive pillar 192 is aligned with the top surface of the sidewall insulating layer 161, and the sidewall insulating layer 161 may completely cover the sidewall of the conductive pillar 192 to provide electrical isolation. The sidewall of the sidewall insulating layer 161 and the sidewall of the conductive pillar 171 are coplanar. The sidewall insulating layer 161 and the conductive pillar 171 are in direct contact with the dielectric structure. The sidewall insulating layer 161 and the conductive pillar 171 are in direct contact with the dielectric layer 140. A portion of the sidewall of the conductive pillar 171 is in contact with the sidewall insulating layer 161. Another portion of the sidewall of the conductive pillar 171 is in contact with the dielectric layer 140 of the dielectric structure. The conductive pillar 171 may have an L-shape or a left-right reversed L-shape. The conductive pillar 171 may have a protruding portion protruding upward, and the protruding portion is in direct contact with the sidewall of the sidewall insulating layer 161 and the liner 190.

Figure 17:
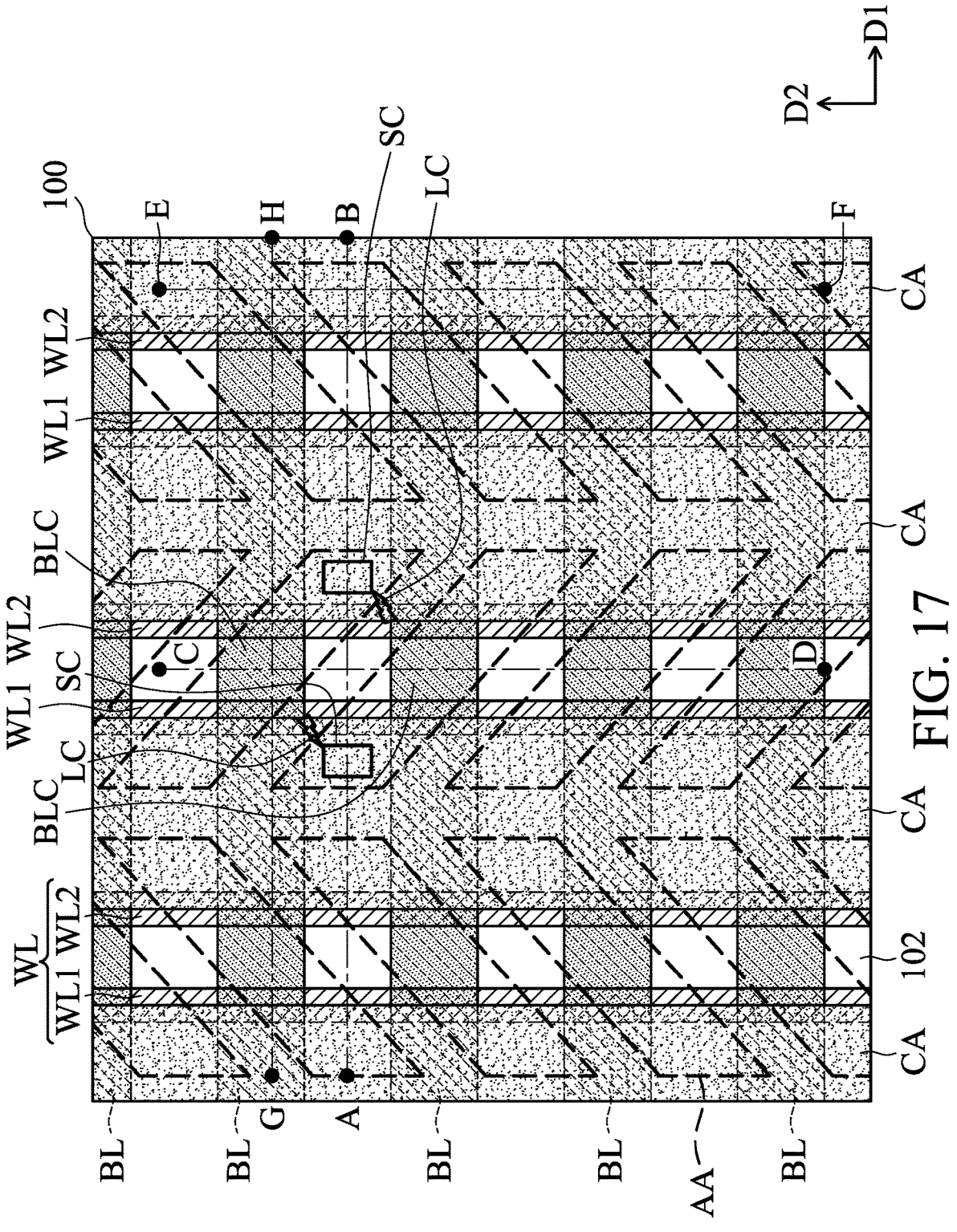
FIG. 17 is a schematic diagram illustrating leakage current in a circuit layout of a semiconductor structure according to some embodiments.

Referring to FIG. 16, a capacitor contact SC may be formed on the contact plug CP, and the capacitor contact SC is electrically connected to the contact plug CP to obtain a semiconductor structure 2. The capacitor contact SC is in contact with the contact plug CP, the sidewall insulating layer 161, and the dielectric structure. The capacitor contact SC is in contact with the dielectric layer 130, the dielectric layer 140, the sidewall insulating layer 161, and the conductive pillar 192. The capacitor contact SC may include polysilicon, amorphous silicon, metal, metal nitride, conductive metal oxide, other suitable materials, or a combination thereof. In some embodiments, the capacitor contact SC may be formed by an etching process and a deposition process. In the cross-sectional view of line A-B of FIG. 16, the bit line conductive layers 124, 126, and 128 (representing a portion of the bit line contact BLC in another active region AA) as shown in the cross-sectional view of line G-H of FIG. 4 are represented with the dotted line. The bit line conductive layers 124, 126, and 128 are a portion of the bit line contact BLC and may serve as a gate contact (GC) in the memory cell region of the semiconductor structure, wherein the gate contact is used to be connected with the gate electrode in the peripheral region of the semiconductor structure. As shown in the cross-sectional view of line A-B of FIG. 16 and FIG. 17, when the sidewall insulating layer 161 is disposed on one active region AA (for example, the central active region AA which the line A-B in FIG. 17 passes), a portion of the bit line contact BLC located in another active region AA (for example, the central active region AA which the line G-H in FIG. 17 passes) that is closest to the one active region AA in the same column (of the array of the active regions) is shown in dotted line. As shown in the cross-sectional view of line A-B of FIG. 16, the sidewall insulating layer 161 is disposed between the capacitor contact SC and the gate contact (GC). As shown in FIG. 17, the sidewall insulating layer 161 is disposed between the capacitor contact SC and the bit line contact BLC. Therefore, the sidewall insulating layer 161 may block the path of the leakage current LC between the capacitor contact SC and the gate contact (GC) and the leakage current LC between the capacitor contact SC and the bit line contact BLC, thereby avoiding generation of the leakage current LC. Thus, the sidewall insulating layer 161 may prevent SC-GC short.

As shown in the cross-sectional view of line A-B of FIG. 16 and FIG. 17, the sidewall insulating layer 161 may improve the insulating property between the contact plug CP in one active region AA (for example, the central active region AA which the line A-B in FIG. 17 passes) and the bit line contact BLC in another adjacent active region AA (for example, the central active region AA which the line G-H in FIG. 17 passes). In particular, the insulating property between the conductive pillar 192 of the contact plug CP and the bit line conductive layers 124, 126, and 128 of the bit line contacts BLC is improved. The sidewall insulating layer 161 may block the path of the leakage current LC between the conductive pillar 192 and the gate contact GC, thereby avoiding the generation of the leakage current LC. Wherein, the conductive pillar 192 may be referred to as a contact (CZ). Therefore, the CZ-GC short may be avoided by the sidewall insulating layer 161. In the cross-sectional view of line E-F of FIG. 16, the sidewall insulating layer 161 may block the path of the leakage current LC between the conductive pillar 192 and the bit line conductive layers 126 and 128. The sidewall insulating layer 161 may block the path of leakage current LC between the capacitor contact SC electrically connected to the conductive pillar 192 and the bit line conductive layers 126 and 128.

Accordingly, the sidewall insulating layer may prevent leakage current between the contact plug and/or the capacitor contact and the bit line contact, thereby improving reliability. The conformally formed sidewall insulating layer may improve the process margin of the capacitor contact. Although a portion of the dielectric structure is removed during the formation of the capacitor contact, the improved insulating properties may still be provided.

The foregoing outlines features of several embodiments so that those skilled in the art may better understand the aspects of the present disclosure. Those skilled in the art should appreciate that they may readily use the present disclosure as a basis for changing, replacing, or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, replaces, and modifies, and alterations herein without departing from the spirit and scope of the present disclosure.

What is claimed is:

1. A semiconductor structure comprising:
a substrate comprising an active region;
a word line structure disposed in the substrate and in the active region;
a dielectric structure disposed on the word line structure;
a contact plug disposed on the substrate and in the active region, wherein the contact plug further comprises:
a first conductive pillar disposed on the substrate; and
a second conductive pillar disposed on the first conductive pillar; and
a sidewall insulating layer disposed on an upper portion of a sidewall of the contact plug, wherein the sidewall insulating layer is in contact with the first conductive pillar, the second conductive pillar, and the dielectric structure,
wherein a top surface of the first conductive pillar is located between a top surface of the sidewall insulating layer and a bottom surface of the sidewall insulating layer.

2. The semiconductor structure as claimed in claim 1, wherein:
a bottom surface of the sidewall insulating layer is lower than a bottom surface of the second conductive pillar.

3. The semiconductor structure as claimed in claim 1, wherein:
a sidewall of the sidewall insulating layer and a sidewall of the first conductive pillar are coplanar; and
the sidewall insulating layer and the first conductive pillar are in contact with the dielectric structure.

4. The semiconductor structure as claimed in claim 1, wherein:

a portion of a sidewall of the first conductive pillar is in contact with the sidewall insulating layer; and
another portion of the sidewall of the first conductive pillar is in contact with the dielectric structure.

5. The semiconductor structure as claimed in claim 1, wherein the dielectric structure further comprises:
a first dielectric layer disposed on the word line structure;
a second dielectric layer disposed on the first dielectric layer; and
a third dielectric layer disposed on a sidewall of the first dielectric layer and a sidewall of the second dielectric layer,
wherein the sidewall insulating layer is disposed on an upper portion of the third dielectric layer.

6. The semiconductor structure as claimed in claim 5, wherein an etching rate of the sidewall insulating layer is less than an etching rate of the second dielectric layer.

7. The semiconductor structure as claimed in claim 5, wherein an etching rate of the third dielectric layer is less than an etching rate of the second dielectric layer.

8. The semiconductor structure as claimed in claim 5, wherein an etching rate of the third dielectric layer is less than an etching rate of the first dielectric layer.

9. The semiconductor structure as claimed in claim 1, further including:
a capacitor contact electrically connected to the contact plug, and connected to the contact plug, the sidewall insulating layer, and the dielectric structure.

10. The semiconductor structure as claimed in claim 1, wherein the sidewall insulating layer is located between the contact plug in the active region and a bit line contact in another active region.

11. The semiconductor structure as claimed in claim 1, wherein the sidewall insulating layer covers a sidewall of the second conductive pillar.

12. The semiconductor structure as claimed in claim 1, wherein the sidewall insulating layer is separated from the substrate by a distance.

13. A method of forming a semiconductor structure, comprising:
forming a word line structure in an active region of a substrate;
forming a dielectric structure on the word line structure, wherein the dielectric structure has a recess;
forming a sacrificial layer on the recess of the dielectric structure, wherein a top surface of the sacrificial layer is lower than a top surface of the dielectric structure;
forming a sidewall insulating layer on the top surface and a sidewall of the dielectric structure and the top surface of the sacrificial layer;
removing a portion of the sidewall insulating layer to expose the top surface of the dielectric structure and the top surface of the sacrificial layer;
removing the sacrificial layer; and
forming a contact plug on the substrate and in the active region, and wherein an upper portion of the contact plug is in contact with the sidewall insulating layer.

14. The method as claimed in claim 13, wherein the portion of the sidewall insulating layer is removed, leaving another portion of the sidewall insulating layer on an upper portion of the sidewall of the dielectric structure.

15. The method as claimed in claim 13, wherein the formation of the contact plug on the substrate further comprises:
forming a first conductive pillar on the substrate and in the active region;

etching back the first conductive pillar, so that a top surface of the first conductive pillar is between a top surface of the sidewall insulating layer and a bottom surface of the sidewall insulating layer; and forming a second conductive pillar on the first conductive pillar.

16. The method as claimed in claim 15, wherein the formation of the contact plug on the substrate further comprises:

forming a liner on the first conductive pillar, wherein the bottom surface of the sidewall insulating layer is lower than a bottom surface of the liner.

17. The method as claimed in claim 15, wherein the formation of the first conductive pillar further comprises:

depositing a conductive material of the first conductive pillar on the active region of the substrate and an isolation structure;

etching back the conductive material, so that a top surface of the conductive material is lower than the top surface of the dielectric structure;

depositing a self-alignment layer on the dielectric structure, the sidewall insulating layer, and the conductive material;

performing a self-alignment etching process, to remove portions of the self-alignment layer and the conductive material and expose the top surface of the dielectric structure and the isolation structure of the substrate; and performing a planarization process, so that the top surface of the conductive material is aligned with the top surface of the sidewall insulating layer.

18. The method as claimed in claim 17, wherein:

the formation of the first conductive pillar further comprises:

after performing the self-alignment etch process, forming an intermediate layer on the exposed top surface of the dielectric structure and the exposed isolation structure of the substrate, and the planarization process is performed, so that the top surface of the conductive material is aligned with the top surface of the sidewall insulating layer and a top surface of the intermediate layer.

19. The method as claimed in claim 13, wherein the removal of the sacrificial layer further comprises:

removing a portion of the dielectric structure to expose a top surface of the substrate.

* * * * *